United States Patent
Hwang

(10) Patent No.: US 9,275,693 B1
(45) Date of Patent: Mar. 1, 2016

(54) SEMICONDUCTOR DEVICES AND SEMICONDUCTOR SYSTEMS INCLUDING THE SAME

(71) Applicant: SK hynix Inc., Icheon-si Gyeonggi-do (KR)

(72) Inventor: Mi Hyun Hwang, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/560,796

(22) Filed: Dec. 4, 2014

(30) Foreign Application Priority Data

Oct. 20, 2014 (KR) .................... 10-2014-0141631

(51) Int. Cl.
*G11C 7/08* (2006.01)
*G11C 7/06* (2006.01)

(52) U.S. Cl.
CPC ... *G11C 7/08* (2013.01); *G11C 7/06* (2013.01)

(58) Field of Classification Search
CPC .......... G11C 5/147; G11C 5/148; G11C 7/06; G11C 7/08
USPC ........................................ 365/226, 205, 196
See application file for complete search history.

(56) References Cited

U.S. PATENT DOCUMENTS

| 7,447,100 B2 * | 11/2008 | Jang ............................. 365/226 |
| 7,813,200 B2 * | 10/2010 | Seo ............................... 365/205 |
| 2012/0133399 A1 | 5/2012 | Watanabe et al. |

FOREIGN PATENT DOCUMENTS

KR  1020110076676 A  7/2011

* cited by examiner

*Primary Examiner* — Huan Hoang
*Assistant Examiner* — Tri Hoang
(74) *Attorney, Agent, or Firm* — William Park & Associates Ltd.

(57) ABSTRACT

The semiconductor memory device may include a power control signal generator and a sense amplifier circuit. The power control signal generator may generate a first power control signal in response to a detection signal generated from detecting a level of a power supply voltage signal. The sense amplifier circuit may generate a first power signal driven to have a first drive voltage in response to the first power control signal. The sense amplifier circuit may sense and amplify a level of a bit line using the first power signal as a power supply voltage.

17 Claims, 5 Drawing Sheets

SEMICONDUCTOR DEVICES AND SEMICONDUCTOR SYSTEMS INCLUDING THE SAME

CROSS-REFERENCE TO RELATED APPLICATION

The present application claims priority under 35 U.S.C 119(a) to Korean Application No. 10-2014-141631, filed on Oct. 20, 2014, in the Korean Intellectual Property Office, which is incorporated herein by reference in its entirety as set forth in full.

BACKGROUND

1. Technical Field

Embodiments of the present disclosure generally relate to semiconductor devices and semiconductor systems including the same.

2. Related Art

In general, a semiconductor memory device such as a dynamic random access memory (DRAM) device includes a plurality of memory cells. Also, each of the DRAM cells is configured to include a single cell transistor and a single cell capacitor. The plurality of DRAM cells may be disposed at respective ones of intersections of a plurality of word lines and a plurality of bit lines. When the DRAM device operates in a read mode, one the word lines may be selectively enabled to transfer electric charges stored in the cell capacitors of the DRAM cells connected to the selected word line onto the bit lines and signals corresponding to the electric charges on the bit lines may be amplified by sense amplifiers connected to the bit lines. Before the selected word line is enabled, the bit lines may be pre-charged. The sense amplifiers may be driven by a power supply voltage. The power supply voltage may be greater than an internal voltage to obtain a fast sensing speed and a correct amplification operation thereof. This may be referred to as an over driving operation.

SUMMARY

According to various embodiments, a semiconductor device may include a power control signal generator and a sense amplifier circuit. The power control signal generator may generate a first power control signal in response to a detection signal generated from detecting a level of a power supply voltage signal. The sense amplifier circuit may generate a first power signal driven to have a first drive voltage in response to the first power control signal. The sense amplifier circuit may sense and amplify a level of a bit line using the first power signal as a power supply voltage.

According to various embodiments, a semiconductor system may include a controller and a semiconductor device. The controller may output a power supply voltage signal. The semiconductor device may receive the power supply voltage signal, detect a level of power supply voltage signal to generate a detection signal and generate a first power control signal in response to the detection signal. The semiconductor device may sense and amplify a level of a bit line using a first power signal driven to a first drive voltage in response to the first power control signal as a power supply voltage.

According to various embodiments, a semiconductor device may include a power source signal detector configured for receiving a power supply voltage and a target voltage signal, and generating a detection signal based on a level of the power supply voltage and a level of the target voltage signal. The semiconductor device may include a power control signal generator configured for receiving the detection signal and enabling any one of multiple power control signals according to a level of the detection signal. The semiconductor device may include a sense amplifier circuit configured for sensing and amplifying a level difference between a bit line and a complementary bit line in response to the multiple power control signals.

DETAILED DESCRIPTION OF THE EMBODIMENTS

Various embodiments will be described hereinafter with reference to the accompanying drawings. However, the embodiments described herein are for illustrative purposes only and are not intended to limit the scope of the description.

Various examples of embodiments are directed to semiconductor devices and semiconductor systems including the same.

Figure 1:
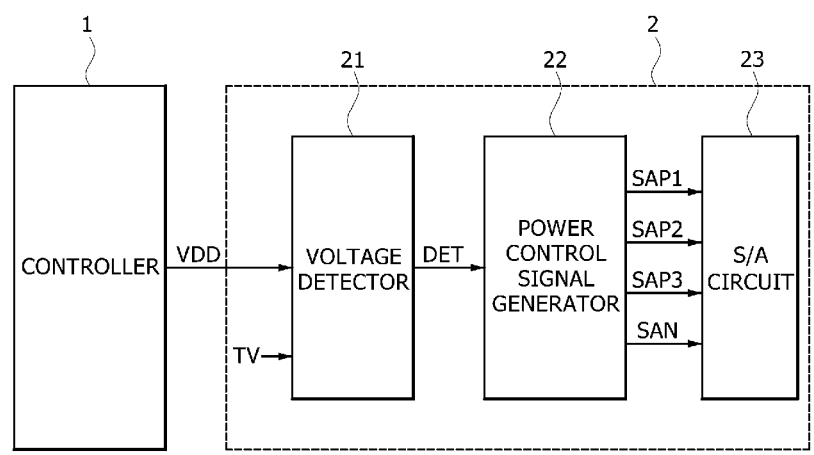
FIG. 1 is a block diagram illustrating a representation of a semiconductor system according to an embodiment.

Referring to FIG. 1, a semiconductor system according to an embodiment may include a controller 1 and a semiconductor device 2. The semiconductor device 2 may include a power source signal detector 21 (i.e., voltage detector), a power control signal generator 22 and a sense amplifier (S/A) circuit 23.

The controller 1 may generate a power supply voltage signal VDD. The power supply voltage signal VDD may be applied to the semiconductor device 2. The level of the power supply voltage signal VDD may set to have various levels according to the various embodiments.

The power source signal detector 21 may detect the level of the power supply voltage signal VDD. The level of the power supply voltage signal VDD may be detected in response to the power source signal detector 21 receiving a target voltage signal TV. In response to detecting the level of the power supply voltage signal VDD and in response to receiving the target voltage signal TV, the power source signal detector 21 may generate a detection signal DET. For example, the power source signal detector 21 may generate the detection signal DET having a logic "high" level when the level of the power supply voltage signal VDD is lower than the level of the target voltage signal VT. For example, the power source signal detector 21 may generate the detection signal DET having a logic "low" level when the level of the power supply voltage signal VDD is higher than the level of the target voltage signal VT. A logic level of the detection signal DET according to the level of the power supply voltage signal VDD may be different according to the various embodiments.

In response to the detection signal DET, the power control signal generator 22 may generate a first power control signal SAP1, a second power control signal SAP2, a third power control signal SAP3 and a fourth power control signal SAN. The power control signal generator 22 may generate the third power control signal SAP3. The third power control signal SAP3 may be enabled according to a logic level of the detection signal DET. For example, the power control signal generator 22 may generate the third power control signal SAP3 enabled during a predetermined period according to the detection signal DET having a logic "high" level when the level of the power supply voltage signal VDD is lower than the level of the target voltage signal VT. For example, in contrast, the power control signal generator 22 may generate the third power control signal SAP3 disabled according to the detection signal DET having a logic "low" level when the level of the power supply voltage signal VDD is higher than the level of the target voltage signal VT. In various embodiments, the power control signal generator 22 may be configured to enable any one among the first, second and fourth power control signals SAP1, SAP2 and SAN according to the level of the power supply voltage signal VDD. Alternatively, the power control signal generator 22 may be configured to enable at least two among the first to fourth power control signal SAP1, SAP2, SAP3 and SAN according to the level of the power supply voltage signal VDD.

The S/A circuit 23 may sense and amplify a level difference between a bit line (BL of FIG. 2) and a complementary bit line (BLB of FIG. 2) in response to the first to fourth power control signals SAP1, SAP2, SAP3 and SAN. The first, second and third power control signals SAP1, SAP2 and SAP3 may control a level of a first power signal (RTO of FIG. 2). The first power signal RTO may be supplied to a bit line S/A (232 of FIG. 2) included in the S/A circuit 23. The fourth power control signal SAN may control a level of a second power signal (SB of FIG. 2). The second power signal SB may be supplied to the bit line S/A (232 of FIG. 2) included in the S/A circuit 23. The third power control signal SAP3 supplied to the sense amplifier circuit 23 may be, for example, enabled according to the detection signal DET having a logic "high" level when the level of the power supply voltage signal VDD is lower than the level of the target voltage signal VT. The third power control signal SAP3 supplied to the sense amplifier circuit 23 may be, for example, disabled according to the detection signal DET having a logic "low" level when the level of the power supply voltage signal VDD is higher than the level of the target voltage signal VT. A configuration and an operation of the S/A circuit 23 will be described hereinafter with reference to FIG. 2.

Figure 2:
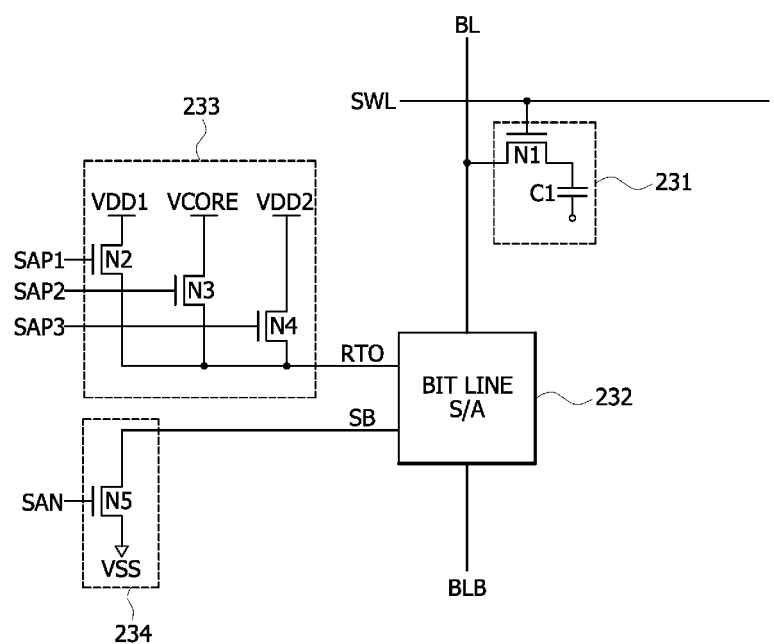
FIG. 2 is a circuit diagram illustrating a representation of a sense amplifier circuit included in the semiconductor system of FIG. 1.

Referring to FIG. 2, the S/A circuit 23 may include a memory cell 231, a bit line S/A 232, and a first power signal driver 233. The S/A circuit 23 may include a second power signal driver 234.

The memory cell 231 may include a cell transistor N1 (e.g., an NMOS transistor) and a cell capacitor C1. The cell capacitor C1 may be connected to a source of the cell transistor N1. If a word line SWL connected to a gate of the cell transistor N1 is selectively enabled to have a logic "high" level while the refresh operation is executed, the cell transistor N1 may be turned on to cause a charge sharing phenomenon between the cell capacitor C1 and the bit line BL connected to a drain of the cell transistor N1. The word line SWL may be selected even while an active operation such as the read operation or the write operation is executed.

The bit line S/A 232 may receive the first power signal RTO and the second power signal SB to sense and amplify a level difference between the bit line BL and the complementary bit line BLB. The bit line S/A 232 may sense a minute voltage difference generated between the bit line BL and the complementary bit line BLB due to the charge sharing phenomenon and may amplify the minute voltage difference between the bit line BL and the complementary bit line BLB.

The first power signal driver 233 may include NMOS transistors N2, N3 and N4 that may drive the first power signal RTO in response to the first, second and third power control signals SAP1, SAP2 and SAP3. The NMOS transistor N2 may be turned on to drive the first power signal RTO to a first drive voltage VDD1 while the first power control signal SAP1 is enabled to have a logic "high" level. The NMOS transistor N3 may be turned on to drive the first power signal RTO to a second drive voltage VCORE while the second power control signal SAP2 is enabled to have a logic "high" level. The NMOS transistor N4 may be turned on to drive the first power signal RTO to a third drive voltage VDD2 while the third power control signal SAP3 is enabled to have a logic "high" level. According to an embodiment, the third drive voltage VDD2 may be set to have a level higher than the first drive voltage VDD1 and the first drive voltage VDD1 may be set to have a level higher than the second drive voltage VCORE. The first, second and third drive voltages VDD1, VCORE and VDD2 may be set to have various levels according to the various embodiments.

The second power signal driver 234 may include an NMOS transistor N5. The NMOS transistor may drive the second power signal SB in response to the fourth power control signal SAN. The NMOS transistor N5 may be turned on to drive the second power signal SB to a ground voltage VSS while the fourth power control signal SAN is enabled to have a logic "high" level.

An operation of the semiconductor system having the aforementioned configurations will be described more fully hereinafter with reference to FIG. 3 and FIG. 4.

Figure 3:
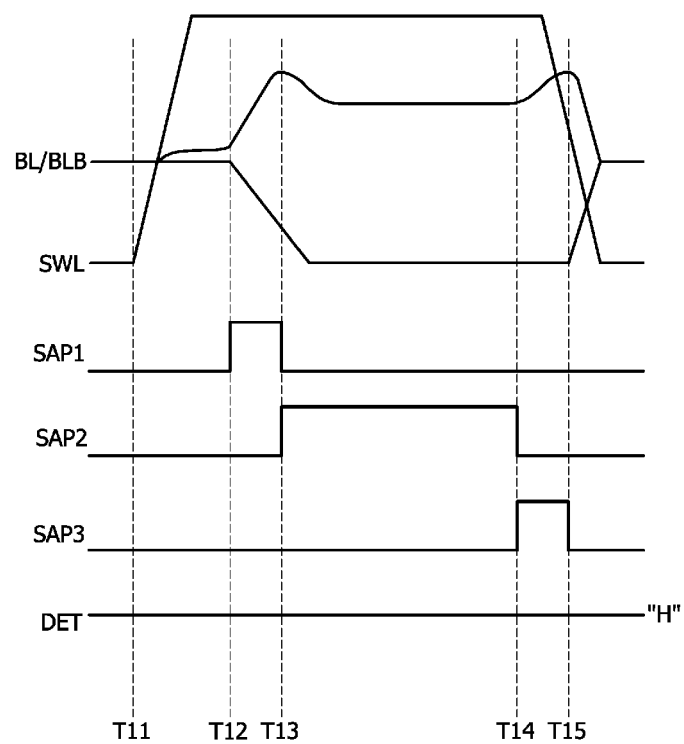
FIG. 3 and FIG. 4 are timing diagrams illustrating a representation of an operation of the semiconductor system illustrated in FIG. 1.

Referring to FIG. 3, at a point of time "T11", if the word line SWL is enabled to have a logic "high" level, a minute voltage difference may be generated between the bit line BL and the complementary bit line BLB due to a charge sharing phenomenon. During a first period from a point of time "T12" till a point of time "T13", the first power control signal SAP1 may be enabled to have a logic "high" level to drive the first power signal RTO to the first drive voltage VDD1. The bit line S/A 232 to which the first power signal RTO is supplied may sense and amplify a voltage difference between the bit line BL and the complementary bit line BLB. The first drive voltage VDD1 may be a power supply voltage which is supplied from an external device or an external system to execute an over driving operation. During a second period from the point of time "T13" till a point of time "T14", the second power control signal SAP2 may be enabled to have a logic "high" level to drive the first power signal RTO to the second drive voltage VCORE. The bit line S/A 232 to which the first power signal RTO is supplied may sense and amplify a voltage difference between the bit line BL and the complementary bit line BLB. The second drive voltage VCORE may be an internal voltage which is supplied to a memory cell array region (not illustrated). During a third period from the point of time "T14" till a point of time "T15", the first power signal RTO may be driven to the third drive voltage VDD2 because the third power control signal SAP3 is enabled to have a logic "high" level when the detection signal DET has a logic "high" level (i.e., "H"). The bit line S/A 232 to which the first power signal RTO is supplied may sense and amplifier a voltage difference between the bit line BL and the complementary bit line BLB. The third drive voltage VDD2 may be a power supply voltage which is supplied from an external device or an external system to execute an over driving operation.

Figure 4:
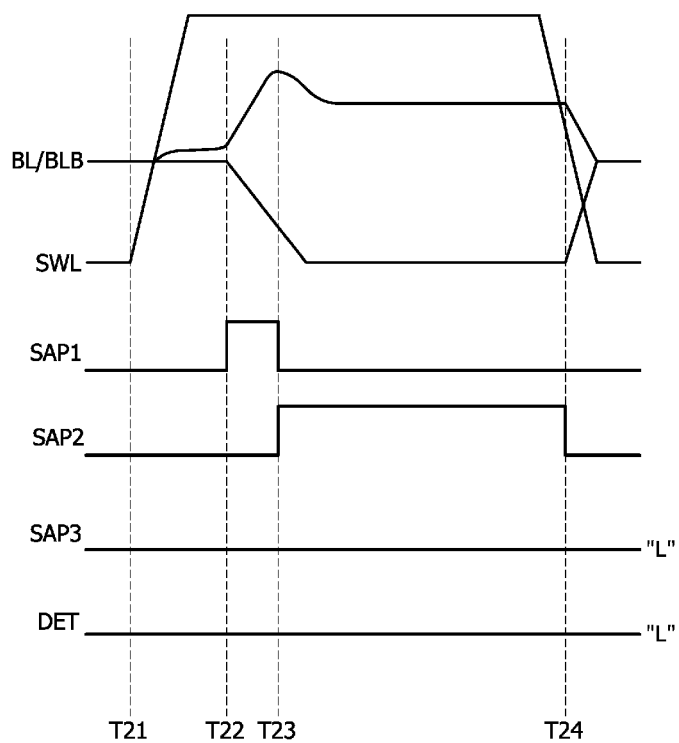

Referring to FIG. 4, at a point of time "T21", if the word line SWL is enabled to have a logic "high" level, a minute voltage difference may be generated between the bit line BL and the complementary bit line BLB due to a charge sharing phenomenon. During a fourth period from a point of time "T22" till a point of time "T23", the first power control signal SAP1 may be enabled to have a logic "high" level to drive the first power signal RTO to the first drive voltage VDD1. The bit line S/A 232 to which the first power signal RTO is supplied may sense and amplify a voltage difference between the bit line BL and the complementary bit line BLB. The first drive voltage VDD1 may be a power supply voltage which is supplied from an external device or an external system to execute an over driving operation. During a fifth period from the point of time "T23" till a point of time "T24", the second power control signal SAP2 may be enabled to have a logic "high" level to drive the first power signal RTO to the second drive voltage VCORE. The bit line S/A 232 to which the first power signal RTO is supplied may sense and amplify a voltage difference between the bit line BL and the complementary bit line BLB. The first power signal RTO may not be driven to the third drive voltage VDD2 because the third power control signal SAP3 is disabled to have a logic "low" level (i.e., "L") when the detection signal DET has a logic "low" level (i.e., "L").

As described above, the semiconductor system according to the embodiments may drive the first power signal RTO supplied to the bit line S/A 232 to the third drive voltage VDD2 according to the level of the power supply voltage signal VDD. For example, the semiconductor system may drive the first power signal RTO to the third drive voltage VDD2 when the level of the power supply voltage signal VDD is lower than the level of the target voltage signal VT. Meanwhile, the semiconductor system according to the embodiments may not drive the first power signal RTO to the third drive voltage VDD2 when the level of the power supply voltage signal VDD is higher than the level of the target voltage signal VT, thereby reducing power consumption. A data retention time of the memory cell may be increased as the level of the power supply voltage signal VDD is raised. Thus, the bit line S/A 232 may sense and amplify the bit line BL and the complementary bit line BLB without the over driving operation when the level of the power supply voltage signal VDD is higher than the level of the target voltage signal VT.

Figure 5:
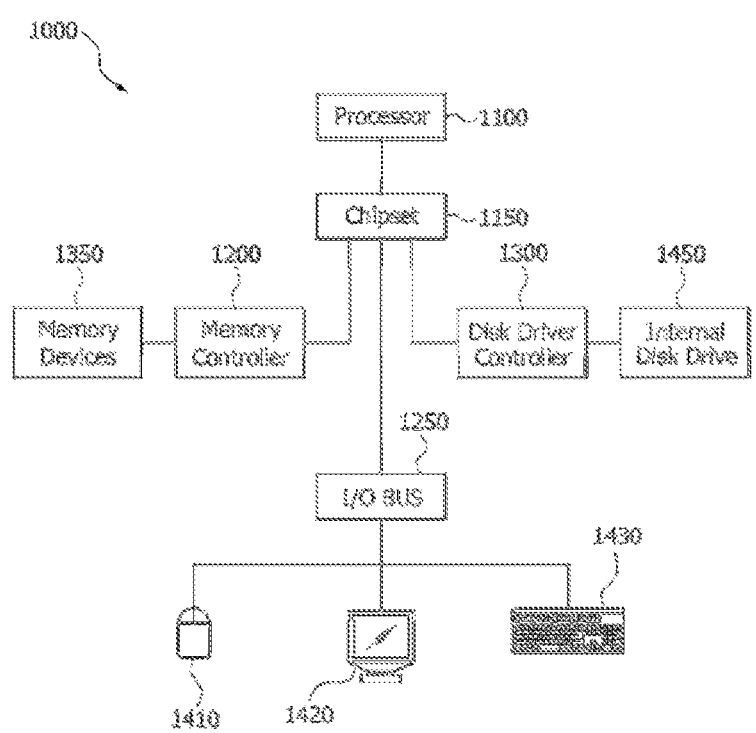
FIG. 5 illustrates a block diagram of an example of a representation of a system employing the semiconductor system and semiconductor devices in accordance with the embodiments discussed above with relation to FIGS. 1-4.

The semiconductor systems and devices discussed above (see FIGS. 1-4) are particular useful in the design of memory devices, processors, and computer systems. For example, referring to FIG. 5, a block diagram of a system employing the semiconductor systems and devices in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor system and/or device as discussed above with reference to FIGS. 1-4. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor system and/or device as discussed above with relation to FIGS. 1-4, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 5 is merely one example of a system employing the semiconductor systems and/or devices as discussed above with relation to FIGS. 1-4. In alternate embodiments, such as cellular phones or digital cameras, the components may differ from the embodiments illustrated in FIG. 5.

What is claimed is:

1. A semiconductor device comprising:
    a power control signal generator suitable for generating a first to a third power control signal in response to a detection signal generated from detecting a level of a power supply voltage signal; and
    a sense amplifier circuit suitable for generating a first power signal driven to have a third drive voltage in response to the third power control signal and suitable for sensing and amplifying a level of a bit line using the first power signal as a power supply voltage, wherein the first power signal is driven to have a first drive voltage in response to the first power control signal and the first power signal is driven to have a second drive voltage in response to the second power control signal.

2. The semiconductor device of claim 1, wherein the third power control signal is enabled when the detection signal is a first logic level and the third power control signal is disabled when the detection signal is a second logic level.

3. The semiconductor device of claim 1,
    wherein the sense amplifier circuit generates the first power signal and drives the first power signal to the first drive voltage in response to the first power control signal during a first period after a memory cell is selected by a word line;

wherein the sense amplifier circuit generates the first power signal and drives the first power signal to the second drive voltage in response to the second power control signal during a second period from a point of time that the first period ends; and wherein the sense amplifier circuit generates the first power signal and drives the first power signal to the third drive voltage in response to the third power control signal during a third period from a point of time that the second period ends.

4. The semiconductor device of claim 1, wherein the third drive voltage is greater than the first drive voltage and the first drive voltage is greater than the second drive voltage.

5. The semiconductor device of claim 1, wherein the first power signal is enabled during a first period after a memory cell is selected by a word line, the second power signal is enabled during a second period from a point of time that the first period ends and the third power signal is enabled during a third period from a point of time that the second period ends.

6. A semiconductor system comprising:
a controller suitable for outputting a power supply voltage signal; and
a semiconductor device suitable for receiving the power supply voltage signal, suitable for detecting a level of power supply voltage signal to generate a detection signal, suitable for generating a first to a third power control signal in response to the detection signal, and suitable for sensing and amplifying a level of a bit line using a first power signal driven to a third drive voltage in response to the third power control signal as a power supply voltage, wherein the first power signal is driven to have a first drive voltage in response to the first power control signal and the first power signal is driven to have a second drive voltage in response to the second power control signal.

7. The semiconductor system of claim 6, wherein the third power control signal is enabled when the detection signal is a first logic level, and the third power control signal is disabled when the detection signal is a second logic level.

8. The semiconductor system of claim 6, wherein the semiconductor device include:
a power control signal generator suitable for generating the first to the third power control signal; and
a sense amplifier circuit suitable for sensing and amplifying the level of the bit line using the first power signal driven to the third drive voltage in response to the third power control signal as the power supply voltage,
wherein the level of the first power control signal is determined according to a level of the detection signal.

9. The semiconductor system of claim 6, wherein the semiconductor device comprises a sense amplifier circuit;
wherein the sense amplifier circuit generates the first power signal and drives the first power signal to the first drive voltage in response to the first power control signal during a first period after a memory cell is selected by a word line,
wherein the sense amplifier circuit generates the first power signal and drives the first power signal to the second drive voltage in response to the second power control signal during a second period from a point of time that the first period ends, and
wherein the sense amplifier circuit generates the first power signal and drives the first power signal to the third drive voltage in response to the third power control signal during a third period from a point of time that the second period ends.

10. The semiconductor system of claim 6, wherein the third drive voltage is greater than the first drive voltage and the first drive voltage is greater than the second drive voltage.

11. The semiconductor system claim 6, wherein the first power signal is enabled during a first period after a memory cell is selected by a word line, the second power signal is enabled during a second period from a point of time that the first period ends and the third power signal is enabled during a third period from a point of time that the second period ends.

12. A semiconductor device comprising:
a power source signal detector configured for receiving a power supply voltage and a target voltage signal, and generating a detection signal based on a level of the power supply voltage and a level of the target voltage signal;
a power control signal generator configured for receiving the detection signal and generating a first to a third power control signals according to a level of the detection signal; and
a sense amplifier circuit configured for sensing and amplifying a level difference between a bit line and a complementary bit line in response to the first to the third power control signal, where in the sense amplifier circuit uses a first power signal as a power supply voltage, and wherein the first power signal is driven to have a first drive voltage in response to the first power control signal, the first power signal is driven to have a second drive voltage in response to the second power control signal and the first power signal is driven to have a third drive voltage in response to the third power control signal.

13. The semiconductor device of claim 12,
wherein a second power signal is driven in response to a fourth power control signal and the sense amplifier circuit senses and drives the level of the bit line using the second power signal as the power supply voltage according to the level of the detection signal.

14. The semiconductor device of claim 12,
wherein a second power signal is driven to a fourth drive voltage in response to a fourth power control signal, and wherein the first, second, third, and fourth drive voltages have different levels.

15. The semiconductor device of claim 14, wherein the second power signal is driven to a ground voltage in response to the fourth power control signal.

16. The semiconductor device of claim 12, wherein the sense amplifier circuit generates the first power signal and drives the first power signal to the first drive voltage in response to the first power control signal during a first period after a memory cell is selected by a word line;
wherein the sense amplifier circuit generates the first power signal and drives the first power signal to the second drive voltage in response to the second power control signal during a second period from a point of time that the first period ends; and
wherein the sense amplifier circuit generates the first power signal and drives the first power signal to the-third drive voltage in response to the third power control signal during a third period from a point of time that the second period ends.

17. The semiconductor device of claim 12, wherein the first power signal is enabled during a first period after a memory cell is selected by a word line, the second power signal is enabled during a second period from a point of time that the first period ends and the third power signal is enabled during a third period from a point of time that the second period ends.

* * * * *